(12) United States Patent
Miller (10) Patent No.: US 9,839,168 B2
(45) Date of Patent: Dec. 5, 2017

(54) SYSTEMS AND METHODS FOR SERVICEABLE EMI SHIELDING

(71) Applicant: Digi International Inc., Minnetonka, MN (US)

(72) Inventor: Timothy John Miller, Bloomington, MN (US)

(73) Assignee: Digi International Inc., Minnetonka, MN (US)

( * ) Notice: Subject to any disclaimer, the term of this patent is extended or adjusted under 35 U.S.C. 154(b) by 157 days.

(21) Appl. No.: 14/610,306

(22) Filed: Jan. 30, 2015

(65) Prior Publication Data

US 2016/0227681 A1 Aug. 4, 2016

(51) Int. Cl.
*H05K 9/00* (2006.01)
*H05K 1/02* (2006.01)

(52) U.S. Cl.
CPC .......... *H05K 9/0032* (2013.01); *H05K 9/003* (2013.01); *H05K 1/0218* (2013.01); *H05K 2201/0145* (2013.01); *H05K 2201/0715* (2013.01)

(58) Field of Classification Search
CPC ......... H05K 1/0218; H05K 2201/0145; H05K 2201/0715; H05K 9/003; H05K 9/0032
See application file for complete search history.

(56) References Cited

U.S. PATENT DOCUMENTS

| | | | | |
|---|---|---|---|---|
| 5,763,824 A * | 6/1998 | King | | H01L 23/552 174/374 |
| 8,570,766 B2 * | 10/2013 | Noguchi | | H05K 5/061 361/641 |
| 2003/0062180 A1 * | 4/2003 | Jones | | H05K 9/0015 174/378 |
| 2008/0297422 A1 * | 12/2008 | Ishida | | H01Q 1/2266 343/702 |
| 2012/0298414 A1 * | 11/2012 | Park | | H05K 9/0032 174/382 |
| 2013/0322039 A1 * | 12/2013 | Teysseyre | | H05K 9/003 361/753 |

OTHER PUBLICATIONS

3M, "3M Material Safety Data Sheet 3M(TM) Electrically Conductive Adhesive Transfer Tape 9703", Sep. 11, 2006, pp. 1-6, Publisher: 3M.
Wikipedia, "Polyethylene terephtalate", "retrieved from http://en.wikipedia.org/wiki/Polyethylene_terephthalate", Jan. 30, 2015, pp. 1-17, Publisher: Wikipedia.
Unknown, "BigTex Grapefruit Juice", "Retrieved from https://www.onthego.kowalskis.com/Admin/thumbnailmainimage.aspx?imgName=70570000011.jpg", Nov. 17, 2014, p. 1 Publisher: Kowalski's Market.

* cited by examiner

Primary Examiner — Yuriy Semenenko
(74) Attorney, Agent, or Firm — Fogg & Powers LLC (57) ABSTRACT

Systems and methods for serviceable EMI shielding are provided. In one embodiment, an electronics device comprises: a circuit board; at least one component mounted to the circuit board; an electro-magnetic interference (EMI) shield that encloses the at least one component within a volume of space, wherein the EMI shield comprises: a sheet of shielding material shaped to define a shield fence and a shield cover, wherein the shield fence is mechanically attached to a surface of the circuit board and extends away from the surface; and a kiss-cut feature in the sheet of shielding material between the shield fence and the shield cover.

18 Claims, 6 Drawing Sheets

SYSTEMS AND METHODS FOR SERVICEABLE EMI SHIELDING

BACKGROUND

It is well known that the operation of some electronic circuits found within industrial and consumer electronics devices can produce radio frequency (RF) electro-magnetic waves capable of interfering with other electronic circuits. This problem is often referred to as electro-magnetic interference (EMI). To mitigate EMI, it is common to install an EMI shield within a device around those components known to generate such unwanted electro-magnetic energy to prevent further propagation of the energy. The EMI shield, typically made from an Aluminum or similar conducting metal usually coupled to a device ground, acts as a high resistance barrier that significantly attenuates the power level of the RF electro-magnetic waves. EMI shields are typically soldered or otherwise semi-permanently mounted into position so that they cannot be easily removed by the end consumer and may be designed so that any tampering with the shied is readily evident.

A difficulty arises however with respect to a unit that needs repair or testing where the EMI shield blocks necessary access to one or more components or test points. Removal of the EMI shield may require de-soldering that is time intensive and therefore expensive. Further, heat from the de-soldering process can damage components proximate to the shield. Two piece EMI shields are one solution that has been proposed to address the need to access components hidden behind EMI shielding. For example, the EMI shield may include a door or window that can be mechanically opened and closed. However, two piece EMI shields are considerably more complex than one-piece shield to fabricate and correspondingly more expensive.

For the reasons stated above and for other reasons stated below which will become apparent to those skilled in the art upon reading and understanding the specification, there is a need in the art for systems and methods for serviceable EMI shielding.

SUMMARY

The Embodiments of the present invention provide methods and systems for providing serviceable EMI shielding and will be understood by reading and studying the following specification.

Systems and methods for serviceable EMI shielding are provided. In one embodiment, an electronics device comprises: a circuit board; at least one component mounted to the circuit board; an electro-magnetic interference (EMI) shield that encloses the at least one component within a volume of space, wherein the EMI shield comprises: a sheet of shielding material shaped to define a shield fence and a shield cover, wherein the shield fence is mechanically attached to a surface of the circuit board and extends away from the surface; and a kiss-cut feature in the sheet of shielding material between the shield fence and the shield cover.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present disclosure provide system and methods for EMI shielding that facilitates cost efficient rework and testing of devices without putting undue stress on other board components which can shorten the product life or further damage the product. Devices may be produced using a one piece shield that comprises an inexpensive kiss-cut feature. If a device never needs service, then the one piece shield remains in-place and intact for the life of the product. For those devices that do require service, the kiss-cut feature allows a portion of the original shielding material to he peeled off to gain access to components within the shielded area. The balance of the original shielding material (referred to herein as a shield fence) remains attached to the device and forms a base upon which a replacement shield cover can be easily affixed. In one embodiment, the replacement shield cover is implemented using a snap-on post-repair cover that is installed over the shield fence. In another embodiment, the replacement shield cover is implemented using a shielding film cover that is applied to the shield fence using a conductive adhesive.

Figure 1:
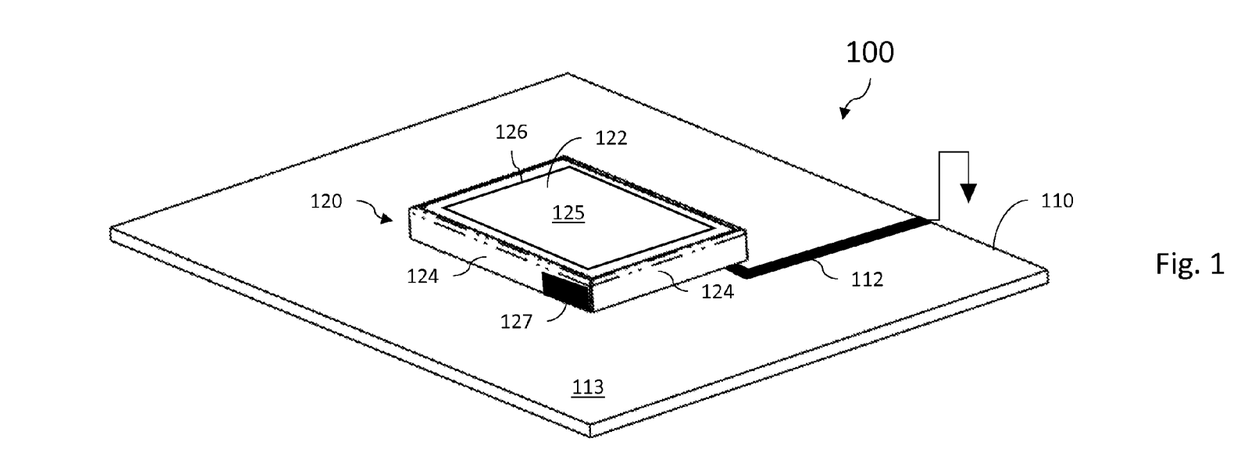
FIGS. 1, 1A, 1B, and 1C are diagrams illustrating a device that comprises a printed an electro-magnetic interference (EMI) shield of one embodiment of the present disclosure.
Figure 1A:
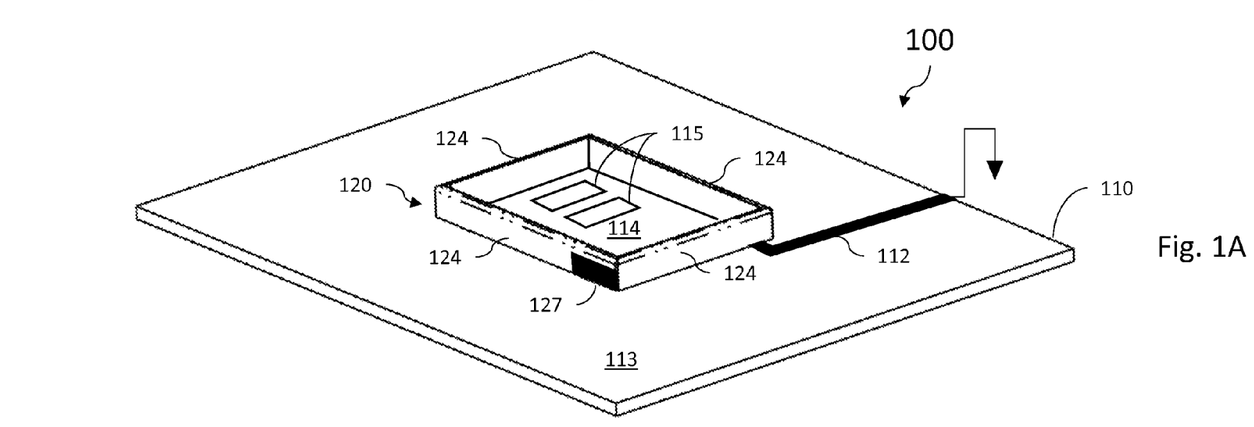

FIGS. 1 and 1A are diagrams illustrating a device 100 that comprises a printed circuit board (PCB) 110 having an electro-magnetic interference (EMI) shield 120 of one embodiment of the present disclosure. EMI shield 120 is electrically coupled to a ground, which may be supplied by a ground trace 112 on PCB 110. In operation, EMI shield 120 acts as a high resistance barrier to RF energy, significantly attenuation the amplitude of propagating RF waves reaching shield 120. As illustrated in FIG. 1A, PCB 110 includes one or more components 115 that either produce RF energy that may interfere with other electronics, or are themselves sensitive to RF energy waved produced by other electronics. RF energy produced by the one or more components 115 are essentially contained within the volume enclosed by EMI shield 120. The EMI shield 120 shown in FIGS. 1 and 1A is a one-piece component, meaning that its form-factor comprises a single piece of shielding material 122 that is shaped to define a shield fence 124 and a shield cover 125. Shielding material 122 comprises a conducting material, for example, a sheet of aluminum or copper, or another metal or metal alloy. FIG. 1 illustrates EMI shield 120 with shield cover 125 in place with shield fence 124. FIG. 1A illustrates shield 120 with shield cover 125 removed and shield fence 124 remaining.

The shield fence 124 is mechanically attached to PCB 110, and extends away from the surface 113 of PCB 110. The shield fence 124 is positioned around a periphery of an area 114 on the surface 113 of PCB 110 that includes the components 115 to be shielded. In one embodiment, shield fence 124 is rigidly attached to PCB 110. For example, shield fence 124 may be soldered to PCB 110 or otherwise rigidly attached to surface 113 using an adhesive. Although in some embodiments shield fence 124 may comprises a continuous ring of material around the shielded area 114, in others it is not. For example, shield fence 124 may be discontinuous and include one or more voids 127 around the periphery of the shielded area 114 (for example where a penetration is needed to feed through a wire or cable). Shield cover 125, which as mentioned above is mechanically part of the same sheet of shielding material 122 as shield fence 124, extends over the area 114 that includes the components 115, enclosing the components within a volume defined by PCB 110, shield fence 124 and shield cover 125. As shown in FIG. 1, shielding material 122 also includes a kiss-cut feature 126 between shield fence 124 and shield cover 125. Kiss-cut feature 126 comprises a partial cut (for example, at least 90%) through the top surface of shielding material 122 along a path that facilitates detachment of shield cover 125 from shield fence 124. That is, with the appropriate mechanical force applied to shield cover 125, the shielding material 122 will essentially tear along the path of kiss-cut feature 126 detaching shield cover 125 from shield fence 124. With shield cover 125 detached from shield fence 124, components 115 within the shielded area 114 are revealed and become accessible through the created opening 129.

It should be noted that shield fence 124 may remain mechanically attached to PCB 110. That is, in most cases there is no need to remove shield fence 124 to obtain access to components 115 to perform testing, repair, or other rework. But it should be noted that if for some reason removal of shield fence 124 from PCB 110 is desired, this can be more easily accomplished with shield cover 125 detached. For example, EMI shields are very often secured to their host PCB using solder that must be heated to reflow to enable the shield's removal. Removal of shield cover 125 permits application of heat (using soldering iron, for example) with more precision directly to target portions of shield fence 124 within area 114 as well as outside area 114. Further, because shield cover 125 is removed, thermal energy is not lost heating the mass of shield cover 125 while attempting to obtain reflow of the solder holding shield fence 124 to PCB 110. More of the applied heat is efficiently conducted through the shield fence 124 to the solder, requiring less total heat to be applied for a shorter time and avoiding damage to surrounding components from unnecessary exposure to heat.

Figure 1B:
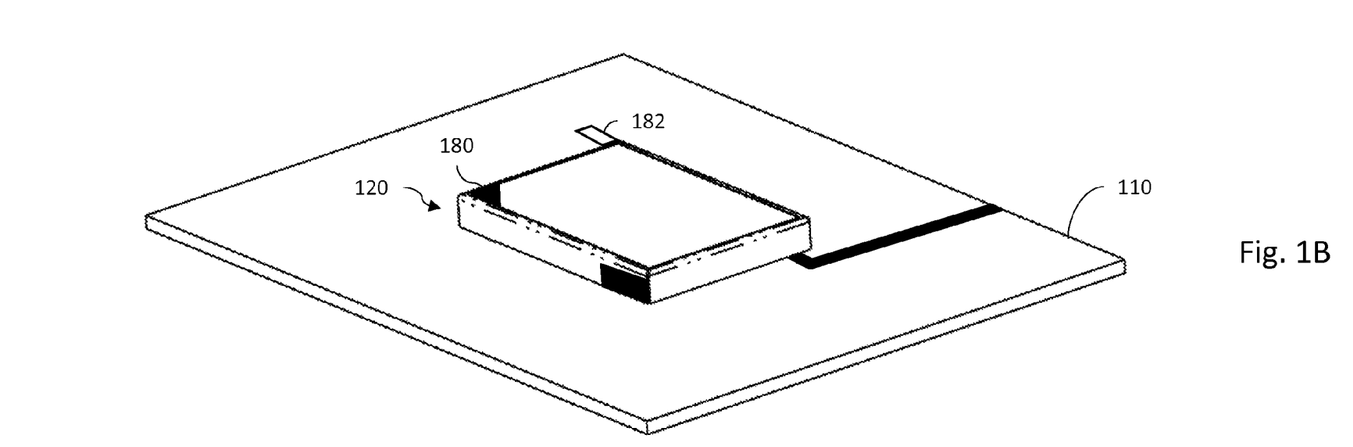
Figure 1C:
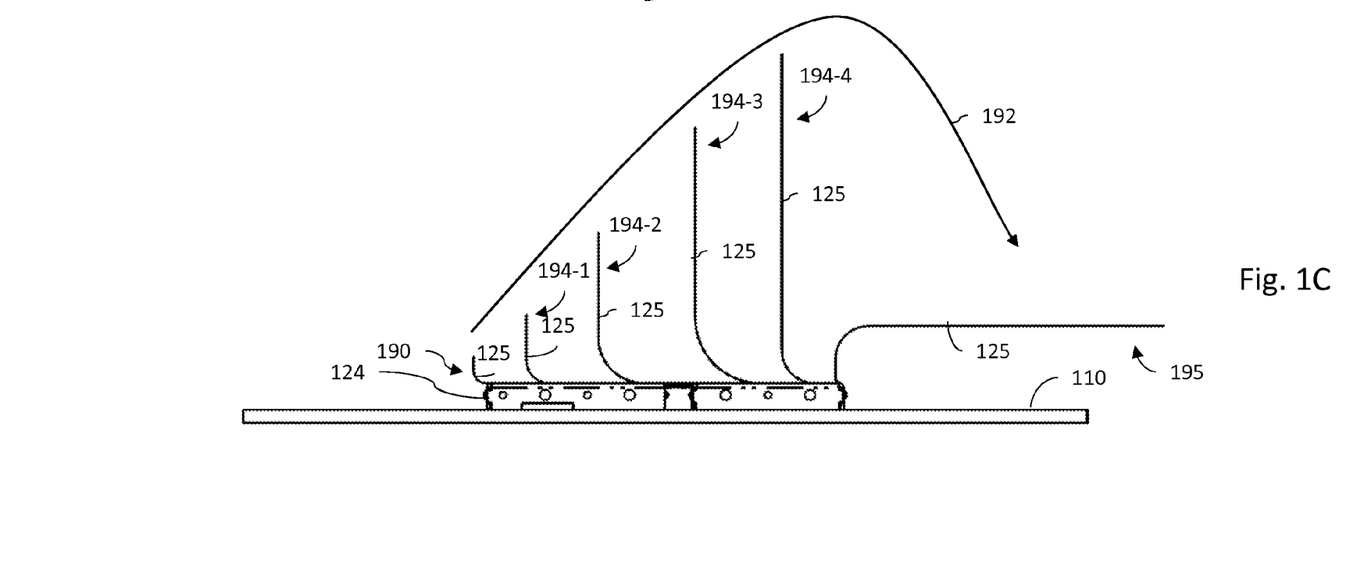

In some embodiments, shield cover 125 may further comprise a lift feature such as a pry hole 180 or lift tab 182 such as shown in FIG. 1B. With pry hole 180, a technician may insert a small screwdriver or other device and apply a leverage to mechanically lift shield cover 125 and peal it away from shield fence 124 along kiss-cut 126. Lift tab 182 provides an alternate mechanism for the technician to grasp a portion of shield cover 125 (for example, using fingers, pliers or a grip tool) and similarly mechanically lift shield cover 125 and peal it away from shield fence 124 along kiss-cut 126. Such lifting and pealing of lift shield cover 125 from shield fence 124 is illustrated in FIG. 1C. Mechanical force is applied to an edge of the sealed shield cover 125 (shown at 190) and a pealing motion 192 is used to progressively detach shield cover 125 from shield fence 124 (illustrated by 194-1, 2, 3 and 4) until it is fully peeled back (at shown at 195). At that point, shield cover 125 may then be detached completely.

Figure 2:
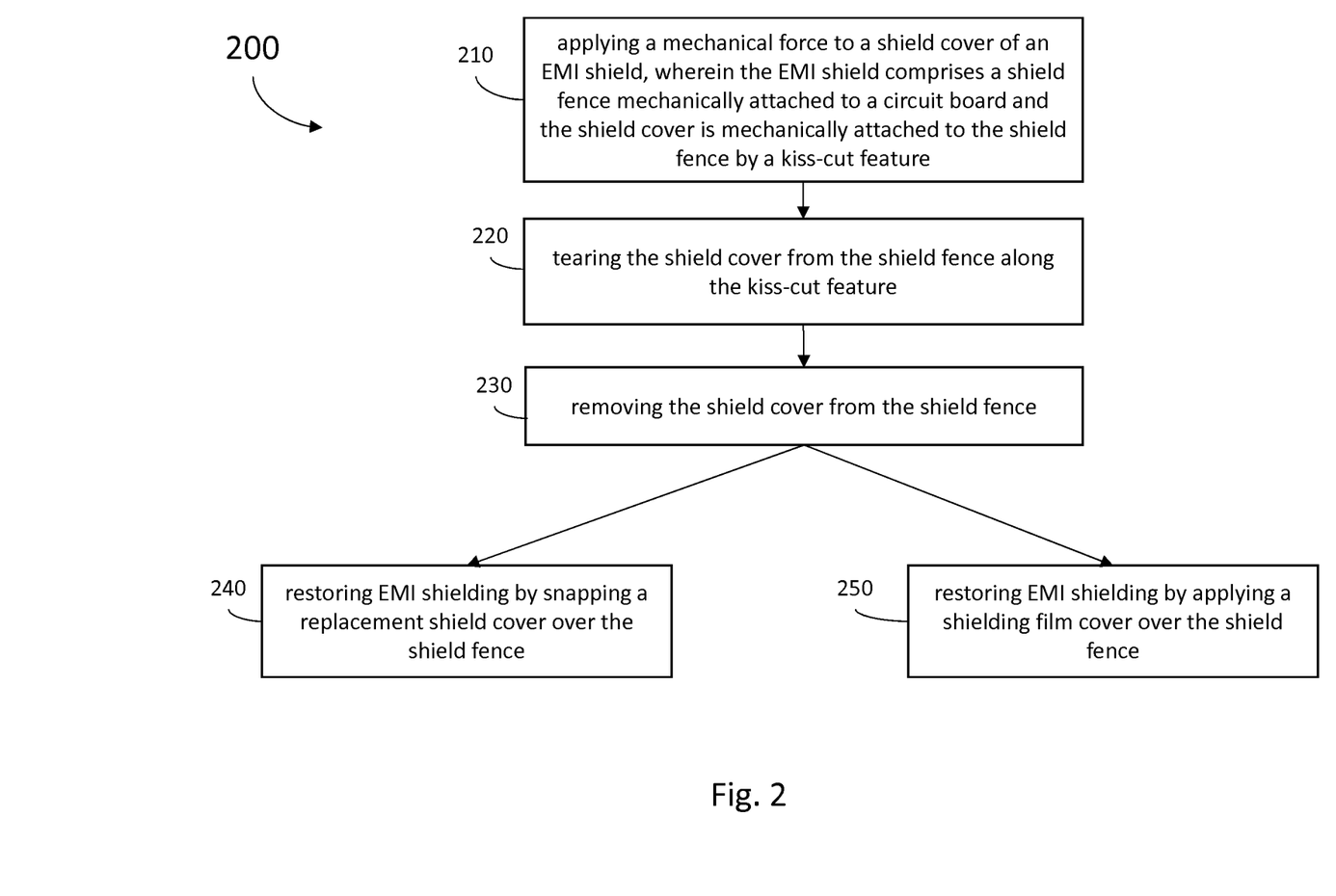
FIG. 2 is a flow chart illustrating a process of one embodiment of the present disclosure.

FIG. 2 is a flow chart describing a process 200 for accessing shielded components on an electronics device such as device 100 shown in FIGS. 1 and 1A. Method 200 begins at 210 with applying a mechanical force to a shield cover of an EMI shield, wherein the EMI shield comprises a shield fence mechanically attached to a printed circuit board (PCB) and the shield cover is mechanically attached to the shield fence by a kiss-cut feature. The shield fence extends away from the surface of the PCB and around a periphery of an area on the surface of the PCB that includes components to be shielded. The kiss-cut feature comprises a partial cut through a surface of the EMI shield along a path that facilitates detachment of the shield cover from the shield fence. In one embodiment, the EMI shield cover includes a lift feature (such as a lifting tab or a pry opening) so that applying the mechanical force to the shield cover included applying the mechanical force to the lift feature such as described with respect to the lift feature of FIG. 1. The process proceeds to 220 with tearing the shield cover from the shield fence along the kiss-cut feature and then to 230 with removing the shield cover from the shield fence. With the shield cover removed, components within the shielded area are revealed and accessible.

Figure 3:
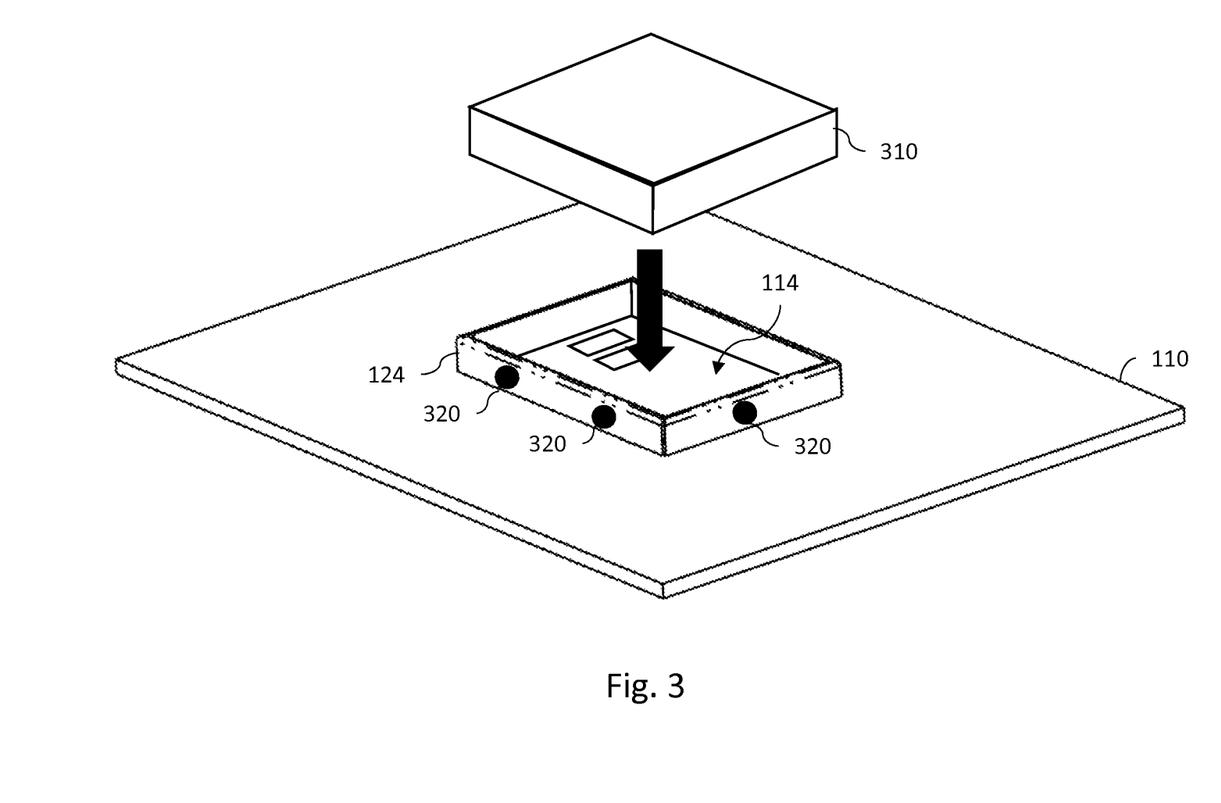
FIG. 3 is a diagram illustrating a snap-on post-repair cover of one embodiment of the present disclosure.

Once rework and testing is finished, to return the device to service, a replacement shield cover to restore EMI shielding is required. In one embodiment, a snap-on post-repair cover 310 is installed onto shield fence 124, such as shown in FIG. 3. As shown in FIG. 3, shield fence 124 may comprise a plurality of dimples 320 that engage with snap-on post-repair cover 310 to secure it in place. Snap-on post-repair cover 310 may be fabricated from any of the same conducting materials as shielding material 122 such as but not limited to aluminum or copper, or another metal or metal alloy. The shield fence 125 may be fabricated to include the dimple features 320 for a nearly negligible incremental cost when the original EMI shield 120 is manufactured. Even if device 100 never needs to be returned for service, the added cost of having the dimples 320 already formed in the shield fence does not appreciably increase fabrication costs of the device. Accordingly, in some embodiments, method 200 may conclude by proceeding to 240 with restoring EMI shielding by snapping a replacement shield cover over the shield fence.

Figure 4A:
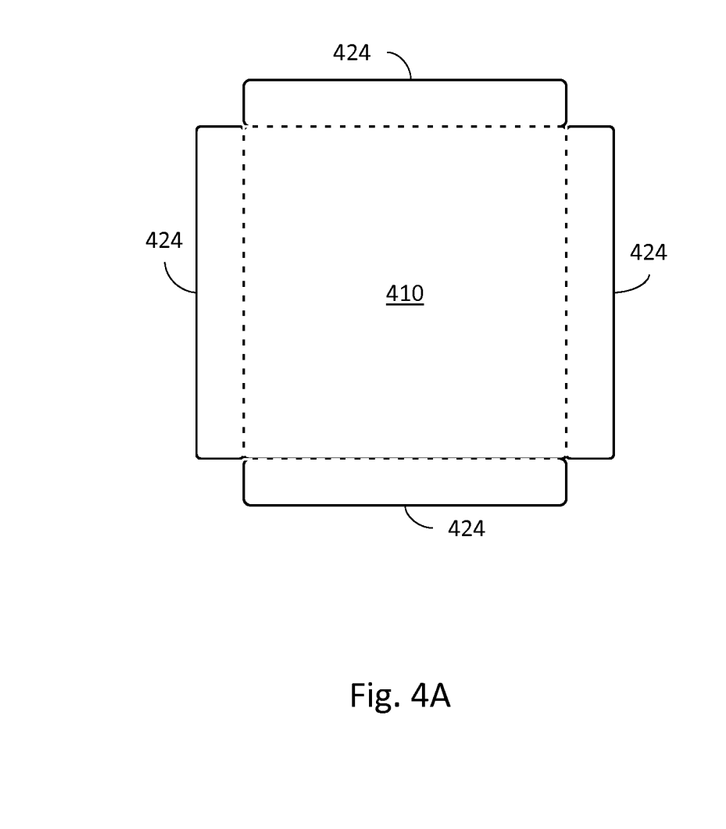
FIGS. 4A, 4B, 4C and 4D are diagrams illustrating a shielding film cover of one embodiment of the present disclosure.
Figure 4B:
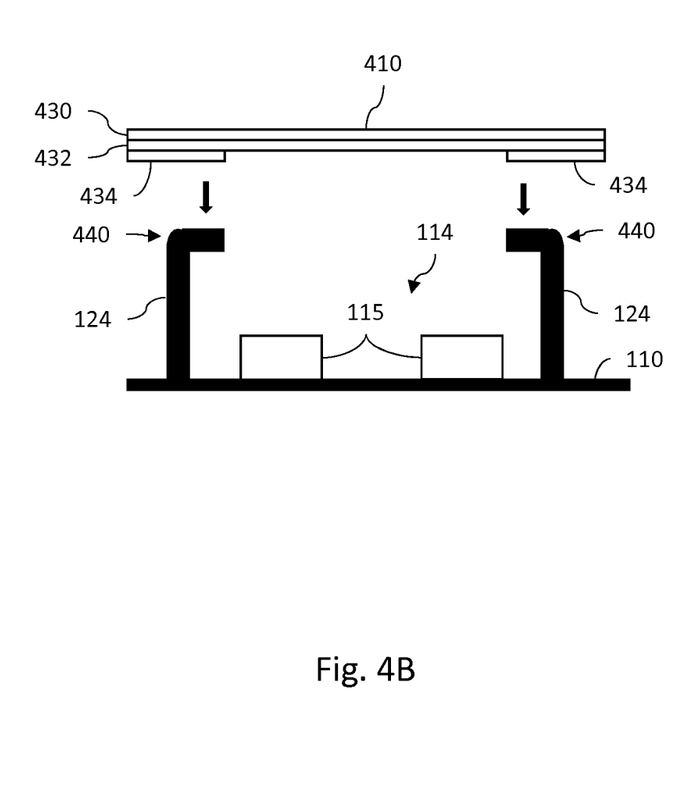

In some applications, EMI shielding tamper prevention, or at least tamper detection, may be an important consideration. FIGS. 4A and 4B illustrate a shielding film cover 410 as one alternative to a snap-on post-repair cover 310. Shielding film cover 410 provides EMI shielding with a degree of tamper resistance, and can be fabricated at a fraction of the cost of a sheet metal post-repair cover a shielding film cover. Accordingly, in some embodiments, method 200 may instead conclude by proceeding to 250 with restoring EMI shielding by applying a shielding film cover over the shield fence.

Figure 4C:
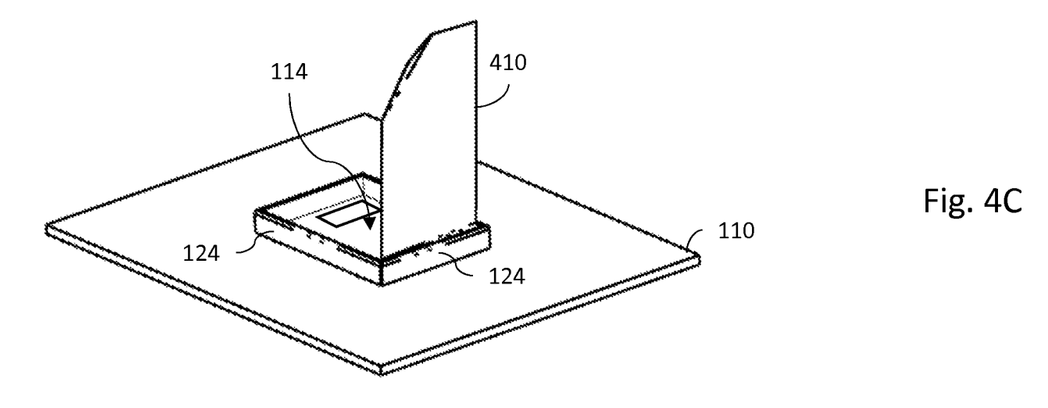
Figure 4D:
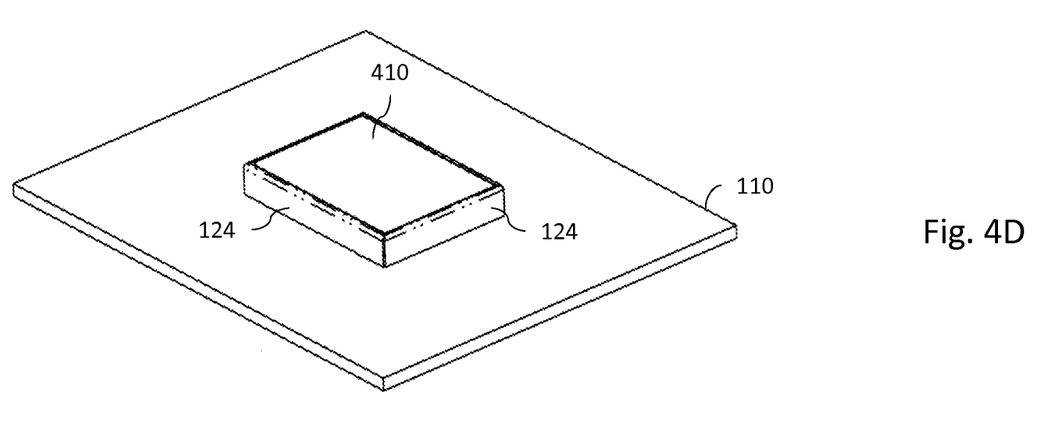

As shown in FIG. 4B, shielding film cover 410 comprises a film material 430 coated with one or more metallization layers 432 (such as layers of Tin, for example) and an electrically conducting adhesive 434 applied to the metallization layers 432. Shielding film cover 410 is applied over the top of shield fence 124 to re-enclose components 115. Shielding film cover 410 may be applied so that the conducting adhesive 434 sticks to the top and/or sides of shield fence 124. For example, in one embodiment, shield fence 124 includes a lip 440 that remains after shield cover 125 is detached. Shielding film cover 410 may be applied so that the conducting adhesive 434 is attached to the upper surface and lip 440 of shield fence 124 to enclose the one or more components 115 within the shielding. In other embodiments, shielding film cover 410 may comprise one or more tabs 424 that fold down around lip 440 and adhere to the side of shield fence 124 instead of, or in addition to, the upper surface of shield fence 124. FIGS. 4C and 4D provide an illustrative example of how shielding film cover 410 may be applied to shield fence 124. As shown in FIG. 4C, in one implementation the adhesive 434 of shielding film cover 410 is applied to one side or segment of shield fence 124 (shown at 450) and the cover 410 material is pulled tight (enough to remove slack) and over the shielded area 114. The adhesive 434 of shielding film cover 410 is then applied to the remaining portion of shield fence 124 to seal shielding film cover 410 over the shielded area 114 as illustrated in FIG. 4D.

The resulting seal from adhering shielding film cover 410 to shield fence 124 need not be airtight, but merely exhibit high resistance to RF waves. Attempts to remove the cover 410 will result in the material tearing, revealing and thus discouraging tampering. Further, if subsequent repairs are needed, the shielding film cover 410 may be torn away, the repair performed, and a new shielding film cover 410 applied.

In one embodiment, the film material 430 of shielding film cover 410 may comprise, for example, a substrate of polycarbonic material or a PET (Polyethylene Terephthalate) film coated with the one or more metallization layers 432 which may comprise tin, aluminum, copper, or other metallic alloy. The thickness of the metallization layer may be tailored to obtain the desired electrical resistance for the RF wave that is to be blocked. For example, in one embodiment, the metallization layer 432 is a tin layer on the order of 0.001-0.005 inches thick.

In one embodiment, shielding film cover 410 may be provided in the form of a pre-cut part sized and shaped at manufacture to accommodate the size and shape of the shield fence to which it will be applied. In other embodiments, shielding film cover 410 may be provided as a sheet of material that may be trimmed to the needed shape and size when applied. In one such embodiment, the shielding film cover 410 may include pre-patterned guides or kiss-cuts to facilitate trimming.

Example Embodiments

Example 1 includes an electronics device, the device comprising: a circuit board; at least one component mounted to the circuit board; an electro-magnetic interference (EMI) shield that encloses the at least one component within a volume of space, wherein the EMI shield comprises: a sheet of shielding material shaped to define a shield fence and a shield cover, wherein the shield fence is mechanically attached to a surface of the circuit board and extends away from the surface; and a kiss-cut feature in the sheet of shielding material between the shield fence and the shield cover.

Example 8 includes an electronics device, the device comprising: a circuit board; at least one component mounted to the circuit board; an electro-magnetic interference (EMI) shield that encloses the at least one component within a volume of space, wherein the EMI shield comprises: a shield fence positioned around a periphery of an area on a surface of the circuit board that includes the at least one component, wherein the shield fence is mechanically attached to a surface of the circuit board and extends away from the surface; and a shielding film cover attached to the shield fence by an electrically conducting adhesive.

Example 15 includes a method for accessing shielded components on an electronics device, the method comprising: applying a mechanical force to a shield cover of an electro-magnetic interference (EMI) shield, wherein the EMI shield comprises a shield fence mechanically attached to a circuit board and the shield cover is mechanically attached to the shield fence by a kiss-cut feature; tearing the shield cover from the shield fence along the kiss-cut feature; and removing the shield cover from the shield fence.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An electronics device, the device comprising:
   a circuit board;
   at least one component mounted to the circuit board;
   an electro-magnetic interference (EMI) shield that encloses the at least one component within a volume of space, wherein the EMI shield comprises:
      a sheet of shielding material shaped to define a shield fence and a shield cover, wherein the shield fence is mechanically attached to a surface of the circuit board and extends away from the surface; and
      a kiss-cut feature in the sheet of shielding material between the shield fence and the shield cover; wherein the kiss-cut feature comprises a partial cut through the top surface of the sheet of shielding material along a path that facilitates detachment of the shield cover from the shield fence.

2. The device of claim 1, wherein the shield fence is positioned around a periphery of an area on the surface of the circuit board that includes the at least one component.

3. The device of claim 2, wherein the shield fence is discontinuous.

4. The device of claim 1, wherein the shielding material comprises a conducting material.

5. The device of claim 4, wherein the conducting material comprises aluminum or copper.

6. The device of claim 1, wherein the shield fence comprises one or more dimples protruding out from the shield fence.

7. An electronics device, the device comprising:
   a circuit board;
   at least one component mounted to the circuit board;
   an electro-magnetic interference (EMI) shield that encloses the at least one component within a volume of space, wherein the EMI shield comprises:
      a shield fence positioned around a periphery of an area on a surface of the circuit board that includes the at least one component, wherein the shield fence is mechanically attached to a surface of the circuit board and extends away from the surface; and
      a shielding film cover attached to the shield fence by an electrically conducting adhesive, wherein the shielding film cover comprises one or more tabs that fold down around a lip of the shield fence and adheres to an external side of the shield fence.

8. The device of claim 7, wherein the shield fence is discontinuous.

9. The device of claim 7, wherein the shield fence comprises a conducting material.

10. The device of claim 9, wherein the conducting material comprises aluminum or copper.

11. The device of claim 7, wherein the shielding film cover comprises:
a film material coated with one or more metallization layers; and
a layer of the electrically conducting adhesive applied to the one or more metallization layers.

12. The device of claim 11, wherein the film material comprises a Polyethylene Terephthalate (PET) film.

13. The device of claim 11, wherein the one or more metallization layers comprise tin, aluminum, copper, or a metallic alloy.

14. A method for accessing shielded components on an electronics device, the method comprising:
applying a mechanical force to a shield cover of an electro-magnetic interference (EMI) shield, wherein the EMI shield comprises a shield fence mechanically attached to a circuit board and the shield cover is mechanically attached to the shield fence by a kiss-cut feature;
tearing the shield cover from the shield fence along the kiss-cut feature; and
removing the shield cover from the shield fence;
wherein the kiss-cut feature comprises a partial cut through a top surface of the EMI shield along a path that facilitates detachment of the shield cover from the shield fence.

15. The method of claim 14, further comprising:
restoring EMI shielding by applying a shielding film cover over the shield fence.

16. The method of claim 15, wherein the shielding film cover comprises:
a film material coated with one or more metallization layers; and
a layer of electrically conducting adhesive applied to the one or more metallization layers.

17. The method of claim 16, wherein the film material comprises a Polyethylene Terephthalate (PET) film.

18. The method of claim 16, wherein the one or more metallization layers comprise tin, aluminum, copper, or a metallic alloy.

* * * * *